(12) United States Patent
Yoshida et al.

(10) Patent No.: US 11,842,904 B2
(45) Date of Patent: *Dec. 12, 2023

(54) CONTROL DEVICE AND SUBSTRATE PROCESSING METHOD

(71) Applicant: Tokyo Electron Limited, Tokyo (JP)

(72) Inventors: Hiroshi Yoshida, Kumamoto (JP); Takahiro Kawazu, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/676,361

(22) Filed: Feb. 21, 2022

(65) Prior Publication Data

US 2022/0181172 A1 Jun. 9, 2022

Related U.S. Application Data

(63) Continuation of application No. 16/704,077, filed on Dec. 5, 2019, now Pat. No. 11,295,966.

(30) Foreign Application Priority Data

Dec. 13, 2018 (JP) ................................. 2018-233583

(51) Int. Cl.
*H01L 21/67* (2006.01)
*H01L 21/306* (2006.01)
*H01L 21/66* (2006.01)

(52) U.S. Cl.
CPC .. *H01L 21/67086* (2013.01); *H01L 21/30604* (2013.01); *H01L 21/67248* (2013.01); *H01L 21/67253* (2013.01); *H01L 22/12* (2013.01)

(58) Field of Classification Search
CPC ......... H01L 21/67086; H01L 21/30604; H01L 21/67248; H01L 21/67253; H01L 22/12; H01L 21/67028; H01L 21/67173; H01L 21/67276; H01L 21/67075; H01L 22/26; H01L 21/67242; H01L 22/10; H01L 22/24; H01L 22/34; Y02P 90/02

See application file for complete search history.

(56) References Cited

U.S. PATENT DOCUMENTS 11,295,966 B2 * 4/2022 Yoshida ............ H01L 21/67276
11,387,152 B1 * 7/2022 Yamamoto ....... G05B 19/41875
(Continued)

FOREIGN PATENT DOCUMENTS

| JP | H10-079351 A | 3/1998 |
| JP | 2016-143684 A | 8/2016 |
| JP | 2017-194951 A | 10/2017 |

*Primary Examiner* — Mohammed Shamsuzzaman
(74) *Attorney, Agent, or Firm* — Venjuris, P.C.

(57) ABSTRACT

A control device for a substrate processing apparatus stores a plurality of records each including a recipe for a substrate etching processing and a control value for a control target, the control value being an actual output value for the control target in the substrate etching processing; acquires a recipe at a start of the substrate etching processing when an abnormality occurs in the temperature sensor or in the concentration sensor; reads a record from among the plurality of records having a recipe identical to the recipe acquired at the start of the substrate etching processing; and executes the substrate etching processing based on the control value of the record read by the processor.

9 Claims, 7 Drawing Sheets

(56) References Cited

U.S. PATENT DOCUMENTS

| | | | | |
|---|---|---|---|---|
| 2010/0152887 A1* | 6/2010 | Kawasaki | ............... | G06F 7/00 |
| | | | | 700/228 |
| 2014/0176701 A1* | 6/2014 | Okuno | ............... | G01N 21/8803 |
| | | | | 348/125 |
| 2015/0170934 A1* | 6/2015 | Aderhold | ......... | H01L 21/67248 |
| | | | | 438/7 |
| 2017/0087606 A1* | 3/2017 | Nakamura | ............. | C23C 16/52 |
| 2017/0285613 A1* | 10/2017 | Asai | ................. | G05B 19/4184 |
| 2017/0300044 A1* | 10/2017 | Asai | ................ | G05B 19/41875 |
| 2018/0024536 A1* | 1/2018 | Yoneda | ............ | H01L 21/67011 |
| | | | | 438/14 |
| 2018/0233384 A1* | 8/2018 | Nagai | ............... | H01L 21/67173 |
| 2018/0247841 A1* | 8/2018 | Nagai | ............... | H01L 21/67253 |
| 2019/0012847 A1* | 1/2019 | Fukuda | ............... | G05B 19/409 |
| 2019/0189490 A1* | 6/2019 | Morita | ............... | H01L 21/68771 |
| 2020/0083080 A1* | 3/2020 | Clark | ............... | H01L 21/31116 |
| 2020/0201305 A1* | 6/2020 | Yamamoto | ....... | G05B 19/41875 |

\* cited by examiner

CONTROL DEVICE AND SUBSTRATE PROCESSING METHOD

CROSS-REFERENCE TO RELATED APPLICATIONS

This application is a continuation application of U.S. patent application Ser. No. 16/704,077, filed on Dec. 5, 2019, which claims priority from Japanese Patent Application No. 2018-233583 filed on Dec. 13, 2018, with the Japan Patent Office, all of which are incorporated herein in their entireties by reference.

TECHNICAL FIELD

Exemplary embodiments disclosed herein relate to a substrate processing method and a substrate processing apparatus.

BACKGROUND

In a substrate processing apparatus of the related art, an attempt has been made to stably perform a substrate processing to increase the productivity. For example, it is known in a substrate processing apparatus that a silicon concentration is measured by a concentration sensor, and a processing liquid is supplied and discharged so that the silicon concentration falls within a predetermined concentration range. See, for example, Japanese Patent Laid-Open Publication No. 2016-143684.

SUMMARY

A substrate processing method according to an aspect of an embodiment includes a generation process that generates a plurality of records each including recipe information in a substrate processing in association with control value information of a control target in the substrate processing, a storage process that stores the plurality of records generated in the generation process, an acquisition process that acquires recipe information input by an operator when performing the substrate processing, a reading process that reads a record including recipe information identical to the recipe information acquired in the acquisition process, and a control process that controls the control target based on the control value information in the recipe information of the record read in the reading process.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Figure 1:
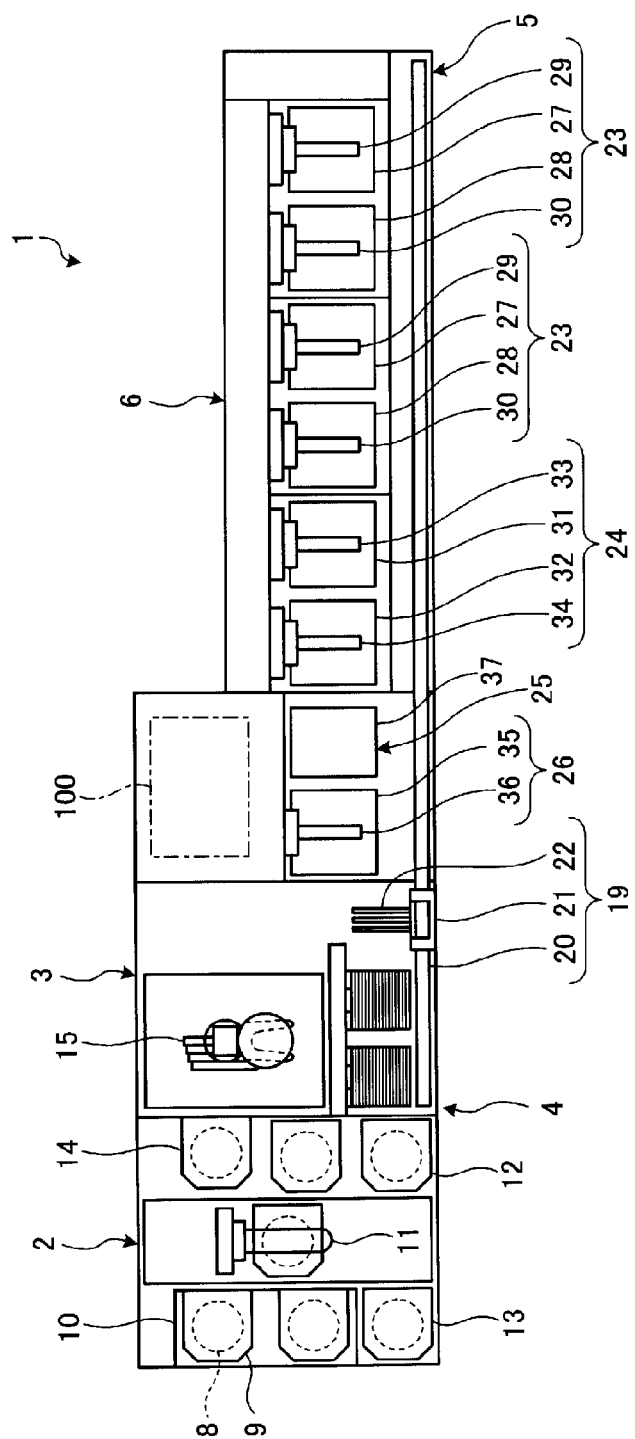
FIG. 1 is a schematic plan view of a substrate processing apparatus according to an embodiment.

As illustrated in FIG. 1, the substrate processing apparatus 1 according to the embodiment includes a carrier carrying-in/out section 2, a lot forming section 3, a lot placing section 4, a lot transfer section 5, a lot processing section 6, and a control device 100. FIG. 1 is a schematic plan view of the substrate processing apparatus 1 according to the embodiment. Here, a direction orthogonal to the horizontal direction will be described as the vertical direction.

The carrier carrying-in/out section 2 performs carry-in and carry-out of a carrier 9 that accommodates a plurality of (e.g., 25) substrates (silicon wafers) 8 vertically side by side in a horizontal posture.

The carrier carrying-in/out section 2 includes a carrier stage 10 on which a plurality of carriers 9 is placed, a carrier transfer mechanism 11 that transfers the carriers 9, carrier stocks 12, 13 that temporarily store the carriers 9, and a carrier stage 14 on which the carriers 9 are placed.

The carrier carrying-in/out section 2 transfers the carrier 9 carried into the carrier stage 10 from the outside to the carrier stock 12 or the carrier stage 14 by using the carrier transfer mechanism 11. That is, the carrier carrying-in/out section 2 transfers the carrier 9 that accommodates the plurality of substrates 8 before being processed by the lot processing section 6 to the carrier stock 12 or the carrier stage 14.

The carrier stock 12 temporarily stores the carrier 9 that accommodates the plurality of substrates 8 before being processed by the lot processing section 6.

The plurality of substrates 8 is carried-out by a substrate transfer mechanism 15 described later from the carrier 9 that is transferred to the carrier stage 14, and accommodates the plurality of substrates 8 before being processed by the lot processing section 6.

Further, the plurality of substrates 8 after being processed by the lot processing section 6 is carried-in from the substrate transfer mechanism 15 to the carrier 9 that is placed on the carrier stage 14, and does not accommodate the substrate 8.

The carrier carrying-in/out section 2 transfers the carrier 9 that is placed on the carrier stage 14, and accommodates the plurality of substrates 8 after being processed by the lot processing section 6 to the carrier stock 13 or the carrier stage 10 by using the carrier transfer mechanism 11.

The carrier 9 transferred to the carrier stage 10 is carried-out to the outside.

The lot forming section 3 includes the substrate transfer mechanism 15 that transfers a plurality (e.g., 25) of substrates 8. The lot forming section 3 forms a lot constituted by a plurality (e.g., 50) of substrates 8 by transferring the plurality (e.g., 25) of substrates 8 twice by the substrate transfer mechanism 15.

The lot transfer section 5 transfers the lot between the lot placing section 4 and the lot processing section 6, or inside the lot processing section 6.

The lot transfer section 5 includes a lot transfer mechanism 19 that transfers the lot. The lot transfer mechanism 19 includes a rail 20 disposed along the lot placing section 4 and the lot processing section 6, and a moving body 21 movable along the rail 20 while holding the lot by the substrate holder 22.

The lot processing section 6 performs a processing such as, for example, etching, cleaning, or drying on the lot formed by the plurality of substrates 8 arranged back and forth and side by side in the vertical posture.

In the lot processing section 6, two etching processing devices 23, a cleaning processing device 24, a substrate holder cleaning processing device 25, and a drying processing device 26 are provided side by side. The etching processing device 23 performs an etching processing on the lot. The cleaning processing device 24 performs a cleaning processing on the lot. The substrate holder cleaning processing device 25 performs a cleaning processing on the substrate holder 22. The drying processing device 26 performs a drying processing on the lot. The number of the etching processing devices 23 is not limited to two, and may be one, or three or more.

The etching processing device 23 includes an etching processing bath 27, a rinse processing bath 28, and substrate elevating mechanisms 29 and 30.

An etching processing liquid (hereinafter, referred to as an "etching liquid") is stored in the etching processing bath 27 to perform the etching processing. A rinse processing liquid (e.g., deionized water) is stored in the rinse processing bath 28 to perform a rinse processing. The details of the etching processing bath 27 will be described later.

In the elevating mechanisms 29 and 30, the plurality of substrates 8 that forms the lot is held back and forth and side by side in the vertical posture.

The cleaning processing device 24 includes a cleaning processing bath 31, a rinse processing bath 32, and substrate elevating mechanisms 33 and 34.

A cleaning processing liquid (e.g., SC-1) is stored in the cleaning processing bath 31. A rinse processing liquid (e.g., deionized water) is stored in the rinse processing bath 32. In the elevating mechanisms 33 and 34, the plurality of substrates 8 for one lot is held back and forth and side by side in the vertical posture.

The drying processing device 26 includes a processing bath 35, and a substrate elevating mechanism 36 that elevates with respect to the processing bath 35.

A drying processing gas (e.g., isopropyl alcohol (IPA)) is supplied into the processing bath 35. In the elevating mechanism 36, the plurality of substrates 8 for one lot is held back and forth and side by side in the vertical posture.

The drying processing device 26 receives the lot from the substrate holder 22 of the lot transfer mechanism 19 by the substrate elevating mechanism 36, and lowers the received lot by the substrate elevating mechanism 36 to carry into the processing bath 35, thereby performing a dry processing on the lot with the drying processing gas supplied into the processing bath 35. Then, the drying processing device 26 raises the lot by the substrate elevating mechanism 36 to deliver the lot on which the drying processing is performed from the substrate elevating mechanism 36 to the substrate holder 22 of the lot transfer mechanism 19.

The substrate holder cleaning processing device 25 includes a processing bath 37, and supplies the cleaning processing liquid and the drying gas into the processing bath 37. The substrate holder cleaning processing device 25 supplies the cleaning processing liquid and then supplies the drying gas to the substrate holder 22 of the lot transfer mechanism 19, thereby performing the cleaning processing on the substrate holder 22.

Figure 2:
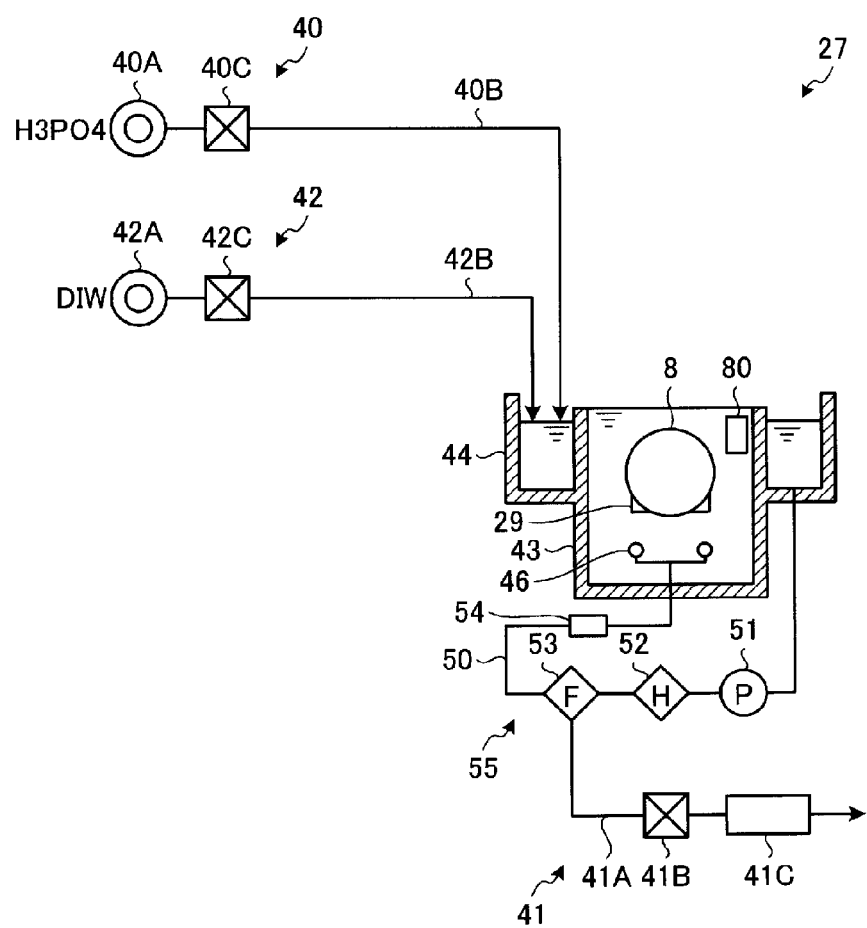
FIG. 2 is a schematic block diagram illustrating a configuration of an etching processing bath according to the embodiment.

Subsequently, descriptions will be made on the etching processing bath 27 with reference to FIG. 2. FIG. 2 is a schematic block diagram illustrating a configuration of the etching processing bath 27 according to the embodiment. In the processing bath 27 illustrated in FIG. 2, a phosphoric acid ($H_3PO_4$) aqueous solution is used as an etching liquid (processing liquid) used in the etching processing. The etching processing illustrated in the present disclosure is an example, and the etching liquid is not limited to the phosphoric acid aqueous solution.

The etching processing bath 27 includes a phosphoric acid aqueous solution supply 40, a phosphoric acid aqueous solution discharger 41, a deionized water supply 42, an inner bath 43, and an outer bath 45.

The phosphoric acid aqueous solution supply 40 includes a phosphoric acid aqueous solution supply source 40A, a phosphoric acid aqueous solution supply line 40B, and a first flow rate regulator 40C.

The phosphoric acid aqueous solution supply source 40A is a tank which stores the phosphoric acid aqueous solution. The phosphoric acid aqueous solution supply line 40B connects the phosphoric acid aqueous solution supply source 40A and the outer bath 44, so as to supply the phosphoric acid aqueous solution from the phosphoric acid aqueous solution supply source 40A to the outer bath 44.

The first flow rate regulator 40C regulates the flow rate of the phosphoric acid aqueous solution supplied to the outer bath 44. The first flow rate regulator 40C is constituted by, for example, an opening/closing valve, a flow rate control valve, or a flow meter.

The deionized water supply 42 includes a deionized water supply source 42A, a deionized water supply line 42B, and a second flow rate regulator 42C. The deionized water supply 42 supplies deionized water DIW to the outer bath 44 to replenish water evaporated by heating the etching liquid. It is possible to regulate the phosphoric acid concentration of the etching liquid by supplying the DIW by the deionized water supply 42.

The deionized water supply line 42B connects the deionized water supply source 42A and the outer bath 44 to supply the deionized water having a predetermined temperature from the deionized water supply source 42A to the outer bath 44.

The second flow rate regulator 42C is provided in the deionized water supply line 42B to regulate the flow rate of the deionized water supplied to the outer bath 44. The second flow rate regulator 42C is constituted by, for example, an opening/closing valve, a flow rate control valve, or a flow meter.

The inner bath 43 is opened at the upper portion, and the etching liquid is supplied to the vicinity of the upper portion. In the inner bath 43, the lot (the plurality of substrates 8) is immersed in the etching liquid by the substrate elevating mechanism 29 to perform the etching processing on the substrates 8. The inner bath 43 is provided with a temperature sensor 80 that detects the temperature of the etching liquid in the inner bath 43.

The outer bath 44 is provided around the upper portion of the inner bath 43 and has an open upper portion. The etching liquid overflowed from the inner bath 43 flows into the outer bath 44. Further, the deionized water is supplied from the deionized water supply 42 to the outer bath 44.

The outer bath 44 and the inner bath 43 are connected with each other by a circulation line 50. One end of the circulation line 50 is connected to the outer bath 44, and the other end of the first circulation line 50 is connected to a processing liquid supply nozzle 46 provided in the inner bath 43.

In the circulation line 50, a pump 51, a heater 52, a filter 53, and a concentration sensor 54 are provided in this order from the outer bath 44 side. The etching liquid in the outer bath 44 is heated by the heater 52 and flows into the inner bath 43 from the processing liquid supply nozzle 46.

The heater 52 heats the etching liquid supplied to the inner bath 43 to a first predetermined temperature suitable for the etching processing. The heater 52 is controlled in an output, that is, the etching amount of the etching liquid, based on a signal from the control device 100 (see FIG. 1). The concentration sensor 54 detects the phosphoric acid concentration of the etching liquid.

The etching liquid is sent from the outer bath 44 through the circulation line 50 to the inner bath 43 by driving the pump 51. Further, the etching liquid flows out to the outer bath 44 again by being overflowed from the inner bath 43. In this way, a circulation path 55 for the etching liquid is formed. That is, the circulation path 55 is formed by the outer bath 44, the circulation line 50, and the inner bath 43. In the circulation path 55, the outer bath 44 is provided upstream of the heater 52 with the inner bath 43 as a reference.

The phosphoric acid aqueous solution discharger 41 discharges the etching liquid when replacing all or a portion of the etching liquid used in the etching processing. The phosphoric acid aqueous solution discharger 41 includes a discharge line 41A, a third flow rate regulator 41B, and a cooling tank 41C.

The discharge line 41A is connected to the circulation line 50. The third flow rate regulator 41B is provided in the discharge line 41A and regulates the discharge amount of the discharged etching liquid. The third flow rate regulator 41B is constituted by, for example, an opening/closing valve, a flow rate control valve, or a flow meter. The cooling tank 41C temporarily stores and cools the etching liquid flowing out through the discharge line 41A.

The opening/closing of the opening/closing valve or the opening degree of the flow rate control valve which constitutes the first flow rate regulator 40C to the third flow rate regulator 41B is changed by an actuator (not illustrated) operating based on the signals from the control device 100. That is, the opening/closing valve or the flow rate control valve which constitutes the first flow rate regulator 40C to the third flow rate regulator 41B is controlled by the control device 100.

Subsequently, descriptions will be made on the control device 100 according to the embodiment. The control device 100 controls the operations of the respective parts of the substrate processing apparatus 1 (including the carrier carrying-in/out section 2, the lot forming section 3, the lot placing section 4, the lot transfer section 5, and the lot processing section 6). The control device 100 controls each part of the substrate processing apparatus 1, based on signals from a switch or the like.

Figure 3:
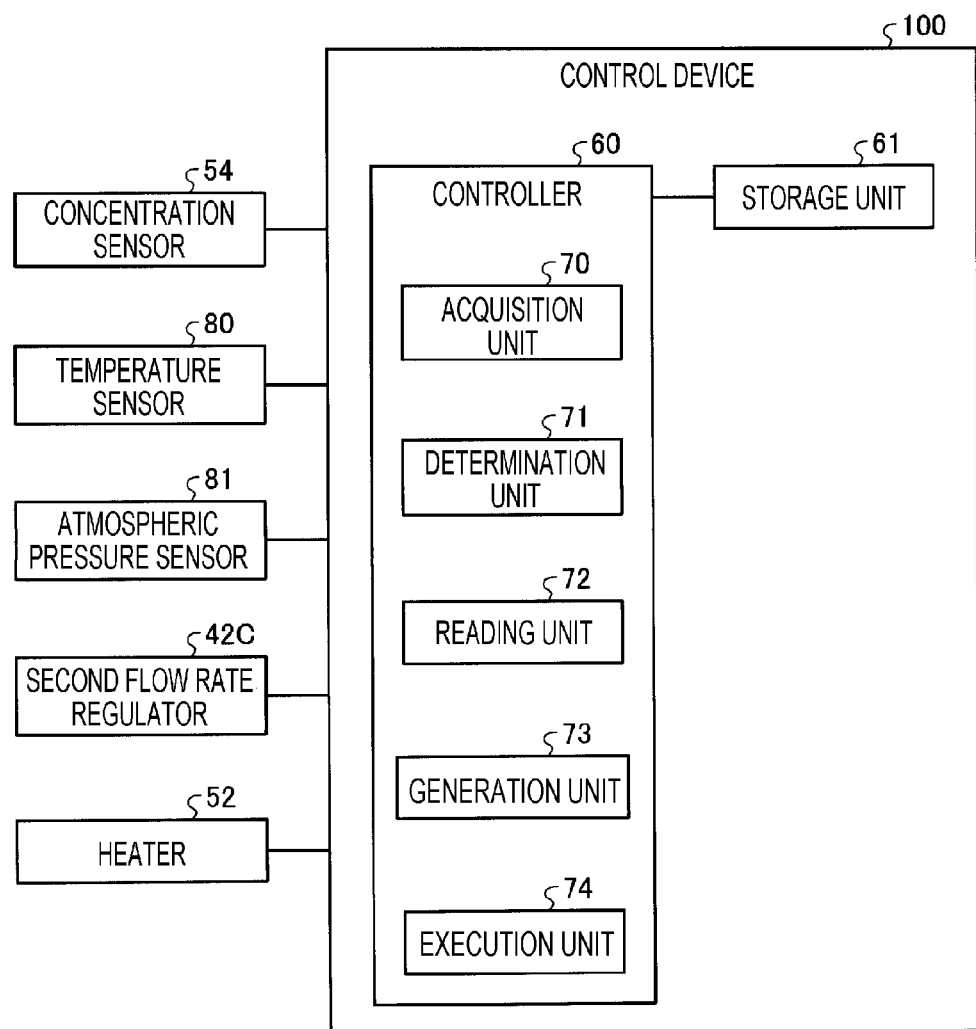
FIG. 3 is a block diagram for explaining a part of a control device according to the embodiment.

Here, descriptions will be made on a part of the function for executing the etching processing in the control device 100 of the embodiment with reference to FIG. 3. FIG. 3 is a block diagram for explaining a part of the control device 100 according to the embodiment.

The control device 100 includes a controller 60 and a storage unit 61. The controller 60 includes an acquisition unit 70, a determination unit 71, a reading unit 72, a generation unit 73, and an execution unit 74.

The controller 60 includes, for example, a microcomputer having a central processing unit (CPU), a read only memory (ROM), a random access memory (RAM), a hard disk drive (HDD), and an input/output port, and various circuits.

The CPU of the computer functions as the acquisition unit 70, the determination unit 71, the reading unit 72, the generation unit 73, and the execution unit 74 of the controller 60 by, for example, reading a program stored in the ROM into the RAM and executing the program. At this time, the RAM is used as a work area of the CPU. Further, the RAM may temporarily store data obtained by the etching processing.

Further, it is also possible to constitute at least a part of or the whole controller 60 by hardware such as an application specific integrated circuit (ASIC) or a field programmable gate array (FPGA).

Further, the storage unit 61 is a computer-readable storage medium. The storage unit 61 stores a program that controls various processings executed in the substrate processing apparatus 1.

The control device 100 controls the operation of the substrate processing apparatus 1 by reading and executing the program stored in the storage unit 61. The program may be stored in a computer-readable storage unit 61, or installed from another storage medium to the storage unit 61 of the control device 100.

The computer-readable storage unit 61 may be, for example, a hard disk (HD), a flexible disk (FD), a compact disk (CD), a magnet optical disk (MO), or a memory card.

The acquisition unit 70 acquires recipe information of the etching processing. The recipe information may be directly input by an operator, or may be input via a terminal device or the like.

The recipe information is a parameter that becomes an etching processing condition, and is set value information set for the elapsed time of the etching processing. The recipe information includes set value information of the phosphoric acid concentration (hereinafter, referred to as a "phosphoric acid set concentration") with respect to the elapsed time of the etching processing, and set value information of the etching liquid (hereinafter, referred to as an "in-bath set temperature") in the inner bath 43. The recipe information may include information on, for example, the silicon concentration in the etching liquid or the height of the liquid level in the inner bath 43.

Further, the acquisition unit 70 acquires a signal for performing feedback control in the etching processing. The acquisition unit 70 acquires the signal from a sensor configured to detect the substrate processing state, specifically, the concentration sensor 54 and the temperature sensor 80.

The acquisition unit 70 acquires the signal with respect to the phosphoric acid concentration (hereinafter, referred to as a "phosphoric acid detected concentration") in the etching liquid detected by the concentration sensor 54. Further, the acquisition unit 70 acquires the signal with respect to the temperature of the etching liquid (hereinafter, referred to as an "in-bath detected temperature") in the inner bath 43 detected by the temperature sensor 80.

The acquisition unit 70 may acquire the signal from, for example, a silicon concentration sensor configured to detect the silicon concentration in the etching liquid, or a liquid level sensor configured to detect the height of the liquid level in the inner bath 43.

Further, the acquisition unit 70 acquires environmental information. The environmental information is information on the environment in the vicinity of the etching processing device 23 at the start of the etching processing. For example, the environmental information is information related to a boiling state of the etching liquid.

The environmental information includes information on atmospheric pressure (hereinafter, referred to as "starting atmospheric pressure") at the start of the etching processing. The starting atmospheric pressure is detected by an atmospheric pressure sensor 81. That is, the acquisition unit 70 acquires the signal with respect to the starting atmospheric pressure detected by the atmospheric pressure sensor 81. The environmental information may include, for example, information on the temperature in the vicinity of the etching processing device 23, information on the humidity in the vicinity of the etching processing device 23, or discharge information of the substrate processing apparatus 1.

The determination unit 71 determines whether there is a record that matches the acquired recipe information and the acquired environmental information at the start of the etching processing.

Various information in the etching processing is associated and registered in the record. The various information includes the recipe information, the environmental information, and control value information in the etching processing.

The control value information is information on the control value of a control target with respect to the elapsed time of the etching processing. The control target is a target that is related to the recipe information, and on which control is executed in order to implement each set value of the recipe information. Further, the control value of the control target is an actual output value with respect to the control target.

For example, when the recipe information is information on the phosphoric acid set concentration, the control target is the flow rate control valve of the second flow rate regulator 42C that regulates the phosphoric acid concentration of the etching liquid. Further, the control value of the control target is the opening degree of the flow rate control valve of the second flow rate regulator 42C, that is, the output value of the actuator that regulates the opening degree of the flow rate control valve. Hereinafter, the control value of the control target as the opening degree of the flow rate control valve of the second flow rate regulator 42C is referred to as a "DIW supply amount."

Further, when the recipe information is information on the in-bath set temperature, the control target is the heater 52. Further, the control value of the control target is the output of the heater 52 (hereinafter, referred to as a "heater output").

The control value information may include information on, for example, the opening degree of the flow rate control valve of the first flow rate regulator 40C.

The determination unit 71 determines whether the etching processing performed in the past with recipe information identical to the acquired recipe information and environmental information identical to the acquired environmental information and the recipe information, the environmental information, and the control value information are already registered and stored in the record. That is, the determination unit 71 determines whether there is a record in which recipe information identical to the acquired recipe information and environmental information identical to the acquired environmental information are registered. When there is no record in which recipe information identical to the acquired recipe information and environmental information identical to the acquired environmental information are registered, the acquired recipe information and the acquired environmental information are stored in the work area.

Further, the determination unit 71 determines whether to switch the control method of the control target based on the signal acquired from the concentration sensor 54 and the temperature sensor 80, from the feedback control to the control (hereinafter, referred to as "storage control") based on the control value information stored in the record.

The determination unit 71 determines that the feedback control is maintained for the control method of the control target related to the sensor in which no abnormality occurs. Further, the determination unit 71 determines that, when an abnormality occurs in the sensor, the control method of the control target related to the sensor in which the abnormality occurs is changed from the feedback control to the storage control.

The abnormality of the sensor is, for example, a state where a value detected by the sensor is deviated far from the normally detected value, or a state where no signal is transmitted due to disconnection or the like. The abnormality of the sensor may be determined by transmitting an abnormal signal from the sensor, or by the determination unit 71.

Further, the determination unit 71 determines whether the etching processing is ended based on the elapsed time of the etching processing.

The reading unit 72 reads a record that matches the acquired recipe information and the acquired environmental information from the storage unit 61 when performing the etching processing. That is, the reading unit 72 reads a record in which recipe information identical to the acquired recipe information and environmental information identical to the acquired environmental information are registered from the storage unit 61.

The generation unit 73 generates, when the etching processing is ended, a record in which various information in the etching processing, specifically, the recipe information, the environmental information, and the control value information are registered. The generation unit 73 generates one record for each etching processing condition. Specifically, the generation unit 73 generates a record for each recipe information and environmental information. That is, the generation unit 73 generates another record when the recipe information and the environmental information are different. The generated record is stored in the storage unit 61.

Figure 4:
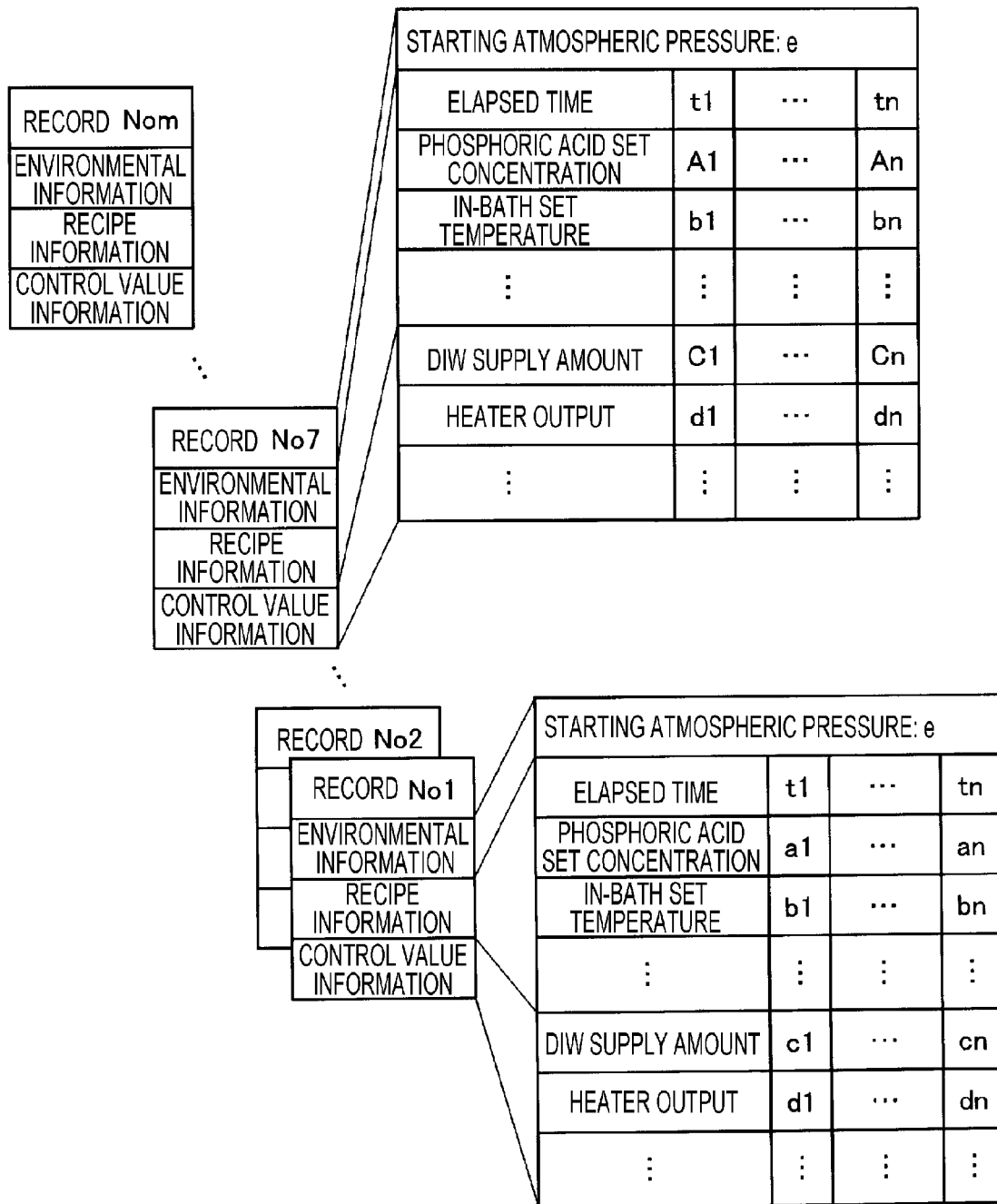
FIG. 4 is a schematic view illustrating a concept of a record according to the embodiment.

For example, the generation unit 73 generates m records as illustrated in FIG. 4. FIG. 4 is a schematic view illustrating a concept of the record according to the embodiment. For example, in a record No1 and a record No7, information on the phosphoric acid set concentration as the recipe information is different, and other recipe information and environmental information are equal.

In the record No1, information on the starting atmospheric pressure "e" is registered as the environmental information. Further, in the record No1, information on the phosphoric acid set value concentration "a1" to "an" is associated and registered as the recipe information with respect to the elapsed time "t1" to "tn" of the etching processing. Further, in the record No1, information on the DIW supply amount, that is, the opening degree "c1" to "cn" of the flow rate control valve of the second flow rate regulator 42C is associated and registered as the control value information.

Further, in the record No1, information on the in-bath set value temperature "b1" to "bn" is associated and registered as the recipe information with respect to the elapsed time "t1" to "tn" of the etching processing. Further, in the record No1, information on the heater output "d1" to "dn" is associated and registered as the control set value information.

In the record No7, information on the starting atmospheric pressure "e" is registered as the environmental information. Further, in the record No7, information on the phosphoric acid set value concentration "A1" to "An" is associated and registered as the recipe information with respect to the elapsed time "t1" to "tn" of the etching processing. Further, in the record No7, information on the DIW supply amount "C1" to "Cn" is associated and registered as the control set value information.

The generation unit 73 generates a record registered in association with the recipe information and the control value information at a predetermined time interval, for example, one minute interval, and the elapsed time, and stores the record in the storage unit 61. Further, the generation unit 73 may generate a record registered in association with the recipe information and the control value information, and the elapsed time when the value of the recipe information is changed, and may store the record in the storage unit 61.

When the etching processing is performed, the generation unit 73 updates the control value information of the record when there is a record in which recipe information identical to the acquired recipe information and environmental information identical to the acquired environmental information are registered. Specifically, after the etching processing is ended, the generation unit 73 overwrites to update the control value information registered in the record with new control value information obtained by the etching processing.

When the etching processing is performed, the generation unit 73 newly generates a record when there is no record in which recipe information identical to the acquired recipe information and environmental information identical to the acquired environmental information are registered. The generation unit 73 newly generates a record when all the control targets are normally ended by the feedback control in the etching processing.

Returning to FIG. 3, the execution unit 74 outputs a control signal with respect to each control target based on the recipe information, and executes control for each control target. The control signal with respect to the control target is a control value of the control target. The control value of the control target is stored in the work area.

The execution unit 74 executes the feedback control based on the detected value of the sensor with respect to the control target related to the sensor in which the abnormality does not occur.

The execution unit 74 stops the feedback control and executes the storage control based on the control value information of the read record, with respect to the control target related to the sensor in which the abnormality occurs. That is, when the abnormality does not occur in the sensor related to the feedback control of the control target, the execution unit 74 executes the feedback control with respect to the control target. Further, when the abnormality occurs in the sensor related to the feedback control of the control target, the execution unit 74 executes the storage control with respect to the control target.

When the storage control is performed, the execution unit 74 outputs the control signal based on the control value information registered in the record.

The execution unit 74 maintains the feedback control with respect to the control target that is not related to the sensor in which the abnormality occurs.

For example, when the abnormality occurs in the concentration sensor 54, and the abnormality does not occur in the temperature sensor 80, the execution unit 74 switches the control with respect to the opening degree of the flow rate control valve of the second flow rate regulator 42C from the feedback control to the storage control. Further, the execution unit 74 maintains the control with respect to the heater 52 to the feedback control.

Figure 5A:
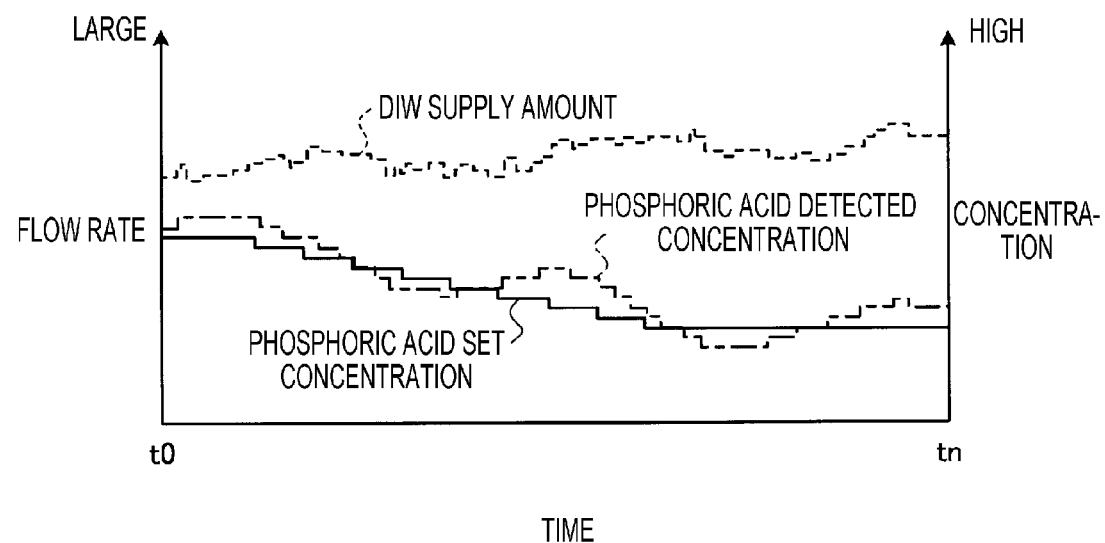
FIG. 5A is a view illustrating a phosphoric acid set concentration, a phosphoric acid detected concentration, and a deionized water (DIW) supply amount when an abnormality does not occur in a concentration sensor in an etching processing according to the embodiment.
Figure 5B:
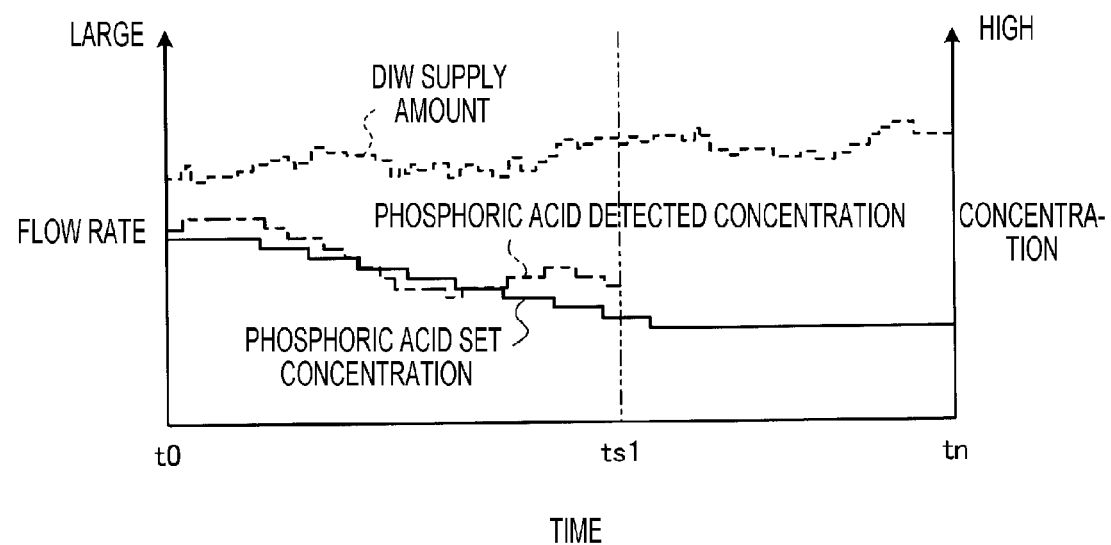
FIG. 5B is a view illustrating a phosphoric acid set concentration, a phosphoric acid detected concentration, and a deionized water (DIW) supply amount when an abnormality occurs in the concentration sensor in the etching processing according to the embodiment.

Subsequently, descriptions will be made on a case where the abnormality occurs in the concentration sensor 54 in the etching processing according to the embodiment with reference to FIGS. 5A and 5B. FIG. 5A is a view illustrating the phosphoric acid set concentration, the phosphoric acid detected concentration, and the DIW supply amount when the abnormality does not occur in the concentration sensor 54 in the etching processing according to the embodiment. FIG. 5B is a view illustrating the phosphoric acid set concentration, the phosphoric acid detected concentration, and the DIW supply amount when the abnormality occurs in the concentration sensor 54 in the etching processing according to the embodiment. Here, it is assumed that the record registered with respect to the recipe information and the environmental information of the etching processing is already stored.

The control device 100 reads the record that matches the recipe information and the environmental information of the etching processing, starts the etching processing by the feedback control at time t0, and ends the etching processing at time tn.

When the abnormality does not occur in the concentration sensor 54, the control device 100 performs the feedback control for the DIW supply amount to set the phosphoric acid set concentration based on the phosphoric acid detected concentration detected by the concentration sensor 54. Specifically, the control device 100 controls the opening degree of the flow rate control valve of the second flow rate regulator 42C to control the DIW supply amount.

In this regard, when the abnormality occurs in the concentration sensor 54 at time ts1, the control device 100 is not able to perform the feedback control for the DIW supply amount based on the phosphoric acid detected concentration, after time is 1.

Therefore, the control device 100 controls the DIW supply amount based on the control value information of the DIW supply amount of the read record, after time ts1.

Therefore, the control device 100 may continue the etching processing while regulating the phosphoric acid concentration, even when the abnormality occurs in the concentration sensor 54.

Figure 6A:
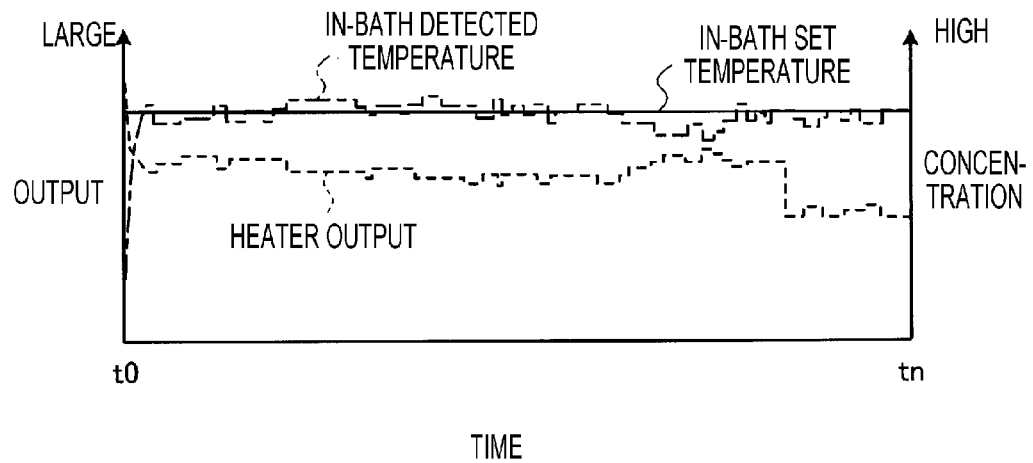
FIG. 6A is a view illustrating an in-bath set temperature, an in-bath detected temperature, and a heater output when an abnormality does not occur in a temperature sensor in the etching processing according to the embodiment.
Figure 6B:
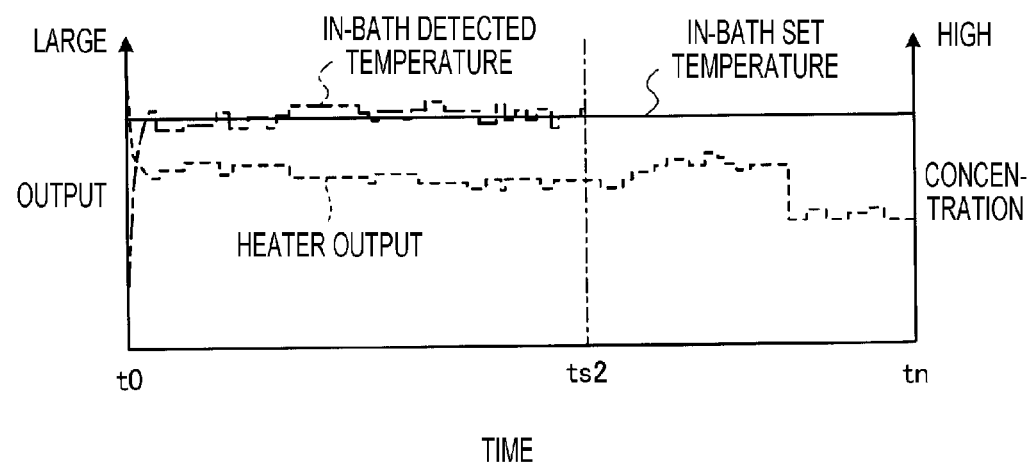
FIG. 6B is a view illustrating an in-bath set temperature, an in-bath detected temperature, and the heater output when an abnormality occurs in the temperature sensor in the etching processing according to the embodiment.

Subsequently, descriptions will be made on a case where the abnormality occurs in the temperature sensor 80 in the etching processing according to the embodiment with reference to FIGS. 6A and 6B. FIG. 6A is a view illustrating the in-bath set temperature, the in-bath detected temperature, and the heater output when the abnormality does not occur in the temperature sensor 80 in the etching processing according to the embodiment. FIG. 6B is a view illustrating the in-bath set temperature, the in-bath detected temperature, and the heater output when the abnormality occurs in the temperature sensor 80 in the etching processing according to the embodiment. Here, it is assumed that the record registered with respect to the recipe information and the environmental information of the etching processing is already stored.

When the abnormality does not occur in the temperature sensor 80, the control device 100 performs the feedback control for the heater output to set the in-bath set temperature based on the in-bath detected temperature detected by the temperature sensor 80.

In this regard, when the abnormality occurs in the temperature sensor 80 at time ts2, the control device 100 controls the heater output based on the control value information of the heater output of the read record, after time ts2.

Therefore, the control device 100 may continue the etching processing while regulating the in-bath temperature, even when the abnormality occurs in the temperature sensor 80.

When the abnormality does not occur in the concentration sensor 54 at time ts2, the control device 100 performs the feedback control for the DIW supply amount to set the phosphoric acid set concentration based on the phosphoric acid detected concentration detected by the concentration sensor 54.

Figure 7:
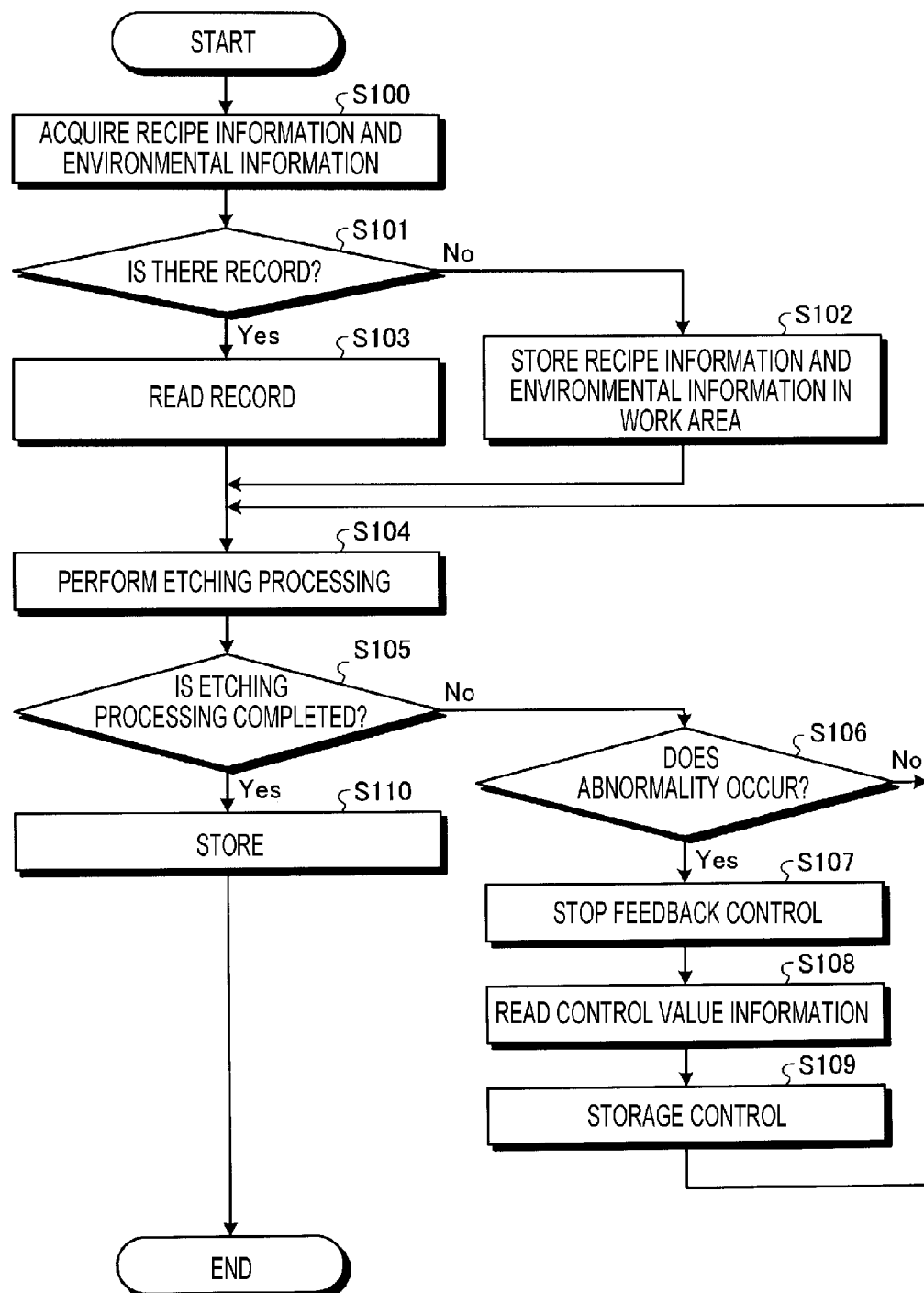
FIG. 7 is a flowchart illustrating the etching processing according to the embodiment.

Subsequently, descriptions will be made on the etching processing according to the embodiment with reference to FIG. 7. FIG. 7 is a flowchart illustrating the etching processing according to the embodiment.

The control device 100 acquires the recipe information and the environmental information in the etching processing (S100). Step S100 is an example of an acquisition process.

The control device 100 determines whether there is a record in which recipe information identical to the acquired recipe information and environmental information identical to the acquired environmental information are registered (S101). When there is no record in which recipe information identical to the acquired recipe information and environmental information identical to the acquired environmental information are registered (S101: No), the control device 100 stores the acquired recipe information and the acquired environmental information in the work area (S102).

When there is a record in which recipe information identical to the acquired recipe information and environmental information identical to the acquired environmental information are registered (S101: Yes), the control device 100 reads the record that matches the acquired recipe information and the acquired environmental information (S103). Step S103 is an example of a reading process.

The control device 100 executes the etching processing (S104). The control device 100 executes the feedback control with respect to each control target and performs the etching processing. Further, the control device 100 stores the control value information of each control target in the feedback control in the work area. Step S104 is an example of a feedback control process.

The control device 100 determines whether the etching processing is ended (S105). When the etching processing is not ended (S105: No), the control device 100 determines whether the abnormality occurs in the concentration sensor 54 or the temperature sensor 80 (S106).

When the abnormality does not occur in the concentration sensor 54 and the temperature sensor 80 (S106: No), the control device 100 continues the etching processing (S104).

When the abnormality occur in the concentration sensor 54 or the temperature sensor 80 (S106: Yes), the control device 100 stops the feedback control for the control target related to the sensor in which the abnormality occurs (S107).

The control device 100 reads the control value information registered in the record with respect to the control target for which the feedback control is stopped (S108).

The control device 100 performs the storage control with respect to the control target based on the read control value information (S109), and continues the etching processing (S104). Step S109 is an example of a control process.

When the etching processing is ended (S105: Yes), the control device 100 stores the record in which the recipe information, the environmental information, and the control value information in the etching processing are registered (S110). Step S110 is an example of a storage process and a generating process.

Specifically, when there is no record in which recipe information identical to the acquired recipe information and environmental information identical to the acquired environmental information are registered, the control device 100 registers the recipe information, the environmental information, and the control value information in a new record and stores the new record. That is, the control device 100 generates and stores a new record.

Further, when there is a record in which recipe information identical to the acquired recipe information and environmental information identical to the acquired environmental information are registered, the control device 100 overwrites to update the control value information registered in the record with the newly obtained control value information. The control device 100 stores the updated record.

Subsequently, descriptions will be made on the effect of the substrate processing apparatus 1 according to the embodiment.

The substrate processing apparatus 1 includes the generation unit 73 that generates the recipe information in the substrate processing and the control value information of the control target in the substrate processing as one record for each recipe information, the storage unit 61 that stores the generated record, the acquisition unit 70 that acquires the recipe information when performing the substrate processing, and the execution unit 74 that controls the control target based on the control value information of the record in which recipe information identical to the acquired recipe information is registered.

That is, the substrate processing apparatus 1 includes, as a substrate processing method, a generating process that generates a plurality of records each including a piece of recipe information in a substrate processing in association with control value information of a control target in the substrate processing as one record for each recipe information, a storage process that stores the plurality of records generated in the generation process, an acquisition process that acquires recipe information input by an operator when performing the substrate processing, a reading process that reads a record in which recipe information identical to the acquired recipe information is stored, and a control process that controls the control target based on the control value information in the recipe information of the record in the reading process.

Therefore, the substrate processing apparatus 1 may perform the storage control based on the opening degree of the flow rate control valve of the second flow rate regulator 42C stored in the record. As a result, the substrate processing apparatus 1 may stably continue the substrate processing. For example, the substrate processing apparatus 1 may continue the etching processing even in a situation different from the normal situation such as when the abnormality occurs or during maintenance.

Further, when the abnormality does not occur in the sensor related to the control target, the substrate processing apparatus 1 controls the control target by the feedback control. Further, when the abnormality occurs in the sensor related to the control target, the substrate processing apparatus 1 controls the control target by the storage control.

Therefore, the substrate processing apparatus 1 may continue the etching processing when the abnormality occurs while accurately controlling the control target by the feedback control.

Further, environmental information in the substrate processing is included in each of the records. The substrate processing apparatus 1 reads a record in which recipe information identical to the acquired recipe information and environmental information identical to the acquired environmental information are registered.

Therefore, when performing the storage control, the substrate processing apparatus 1 may perform the storage control based on the control value information according to the environmental information. As a result, when performing the storage control, the substrate processing apparatus 1 may perform the etching processing accurately according to the environmental information.

Further, the substrate processing apparatus 1 updates the record based on the newly obtained control value information.

Therefore, when the etching processing is performed by the storage control, the substrate processing apparatus 1 may continue the etching processing in a state close to the latest feedback control performed by the identical recipe information and the identical environmental information. As a result, the substrate processing apparatus 1 may accurately perform the etching processing by the storage control.

Further, when the substrate processing is normally ended, that is, when all of the control targets are controlled by the feedback control and ended, the substrate processing apparatus 1 generates and stores a record.

Therefore, the substrate processing apparatus 1 may register the accurate control value information in the record, and store the record. As a result, when performing the storage control, the substrate processing apparatus 1 may accurately perform the etching processing.

Subsequently, descriptions will be made on the substrate processing apparatus 1 according to a modification.

When performing the etching processing, the substrate processing apparatus 1 according to the modification may be configured to be able to select a record by an operator. The substrate processing apparatus 1 according to the modification may read the recipe information stored in the record by selecting the stored record by the operator.

Further, when updating the control value information registered in the record, the substrate processing apparatus 1 according to the modification may update the control value information of the control target for which the feedback control is performed, without updating the control value information of the control target for which the storage control is performed.

Further, when all of the control targets are controlled by the feedback control, and the etching processing is normally ended, the substrate processing apparatus 1 according to the modification may update the control value information. That is, when the etching processing is performed by the storage control, the substrate processing apparatus 1 according to the modification does not update the control value information.

Therefore, the substrate processing apparatus 1 according to the modification may update the control value information registered in the record with the accurate control value information.

The substrate processing apparatus 1 according to the modification, for example, may switch from the feedback control to the storage control by the operation of the operator to control the control target.

Therefore, for example, when variation in the detected value by the sensor occurs, the substrate processing apparatus 1 according to the modification may allow the operator to continue the etching processing by switching from the feedback control to the storage control. Further, the substrate processing apparatus 1 according to the modification may start the etching processing by the storage control even in a state where, for example, the abnormality occurs in the sensor.

Further, when the environmental information, for example, the atmospheric pressure is changed beyond a predetermined range during the etching processing, the substrate processing apparatus 1 according to the modification may stop the etching processing.

The substrate processing apparatus 1 in the above embodiment and the modification has been described as an apparatus that performs the etching processing for processing the plurality of substrates 8. However, this is an example, and the apparatus may perform a single-wafer etching processing that cleans the substrates 8 one by one. Further, the storage control described above may be applied to the drying processing device 26 or the like. That is, the storage control described above may be applied to all of the substrate processing processes for which the recipe information and the control value information of the control target may be obtained. Further, the storage control described above may be applied to a substrate processing in which processing is performed while a substrate is transferred in the horizontal direction by a roller or the like.

The acquisition unit 70 may also acquire a signal from a flow rate sensor that detects the flow rate of the phosphoric acid aqueous solution, a flow rate sensor that detects the flow rate of the deionized water, an exhaust pressure sensor that detects the exhaust pressure of the substrate processing apparatus 1, or the like. That is, in the substrate processing process, the acquisition unit 70 may acquire a signal from all or a portion of the sensors that are used for executing the feedback control. Further, in the substrate processing process, the control target includes a target for which the feedback control is executed. For example, the control target may include a damper that regulates the exhaust pressure of the substrate processing apparatus 1. In this case, the control value of the control target is the output of the damper.

According to an aspect of the embodiment, the substrate processing may be continued stably.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A control device for a substrate processing apparatus, the control device comprising:
a memory; and
a processor coupled to the memory and configured to execute a program stored in the memory for the substrate processing apparatus including a temperature sensor, a concentration sensor and an atmospheric pressure sensor,
wherein the processor is configured to
store, in the memory, a plurality of records each including a recipe for a substrate etching processing and a control value for a control target, the control value being an actual output value for the control target in the substrate etching processing;
acquire a recipe at a start of the substrate etching processing and environmental information acquired by the atmospheric pressure sensor;
when an abnormality occurs in the temperature sensor or in the concentration sensor, read a record from among the plurality of records having a recipe identical to the recipe acquired at the start of the substrate etching processing; and
execute the substrate etching processing based on the control value of the record read by the processor;
wherein the processor is further configured to perform a feedback control for the control target based on a value detected by the temperature sensor or by the concentration sensor and the recipe acquired at the start of the etching processing,
wherein the control target is controlled by the feedback control when an abnormality does not occur in the temperature sensor or in the concentration sensor, and
wherein the control target is controlled based on the control value of the record when an abnormality occurs in the temperature sensor or in the concentration sensor;
wherein the recipe includes a concentration of a processing liquid and a temperature of the processing liquid stored in a processing bath.

2. The control device according to claim 1,
wherein the processor updates the record based on a control value that is newly obtained.

3. The control device according to claim 1,
wherein the processor generates the record including environmental information in the substrate etching processing, acquires the environmental information at the start of the substrate etching processing, and controls the control target based on the control value of the record in which the recipe identical to the recipe acquired at the start of the etching processing and environmental information identical to the acquired environmental information are registered.

4. The control device according to claim 1,
wherein the processor generates the plurality of records each including environmental information in the substrate processing, acquires environmental information at the start of the substrate processing, and controls the control target based on the control value information of the record including recipe information identical to the acquired recipe information and environmental information identical to the acquired environmental information.

5. The control device according to claim 3, wherein the plurality of records is generated and stored in the memory when the substrate etching processing is normally ended.

6. The control device according to claim 1, wherein the processor is configured to acquire the recipe from an operator of the substrate processing apparatus at the start of the substrate etching processing.

7. The control device according to claim 3, wherein the environmental information includes at least one of an atmospheric pressure detected by the atmospheric pressure sensor at the start of the substrate etching processing, a temperature in a vicinity of the substrate processing apparatus measured by the temperature sensor, and a humidity in the vicinity of the substrate processing apparatus.

8. The control device according to claim 3, wherein the processor is further configured to determine whether there is a record, among the plurality of records, that is identical to the recipe acquired at the start of the substrate etching processing and the acquired environmental information.

9. The control device according to claim 8, wherein the processor is further configured to determine whether the abnormality occurs in the temperature sensor or in the concentration sensor, and further determine to switch between the feedback control and a storage control based on whether the abnormality occurs, the storage control controlling the substrate etching processing based on the control value of the plurality of records stored in the memory.

* * * * *